United States Patent
Pierrat

[19]

[11] Patent Number: 6,077,630
[45] Date of Patent: *Jun. 20, 2000

[54] SUBRESOLUTION GRATING FOR ATTENUATED PHASE SHIFTING MASK FABRICATION

[75] Inventor: Christophe Pierrat, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/004,183

[22] Filed: Jan. 8, 1998

[51] Int. Cl.$^7$ .................................................. G03F 9/00

[52] U.S. Cl. ........................................................ 430/5

[58] Field of Search ................................ 430/5, 322, 324; 216/12, 24

[56] References Cited

U.S. PATENT DOCUMENTS

| | | | |
|---|---|---|---|
| H1525 | 4/1996 | Geil et al. | 355/44 |
| 4,608,268 | 8/1986 | Shimkunas | 427/8 |
| 4,653,860 | 3/1987 | Hendrix | 350/336 |
| 4,686,162 | 8/1987 | Stangl et al. | 430/5 |
| 5,045,419 | 9/1991 | Okumura | 430/20 |
| 5,047,117 | 9/1991 | Roberts | 156/643 |
| 5,194,345 | 3/1993 | Rolfson . | |
| 5,194,346 | 3/1993 | Rolfson et al. | 430/5 |
| 5,208,125 | 5/1993 | Lowrey et al. . | |
| 5,217,830 | 6/1993 | Lowrey | 430/5 |
| 5,225,035 | 7/1993 | Rolfson | 156/643 |
| 5,229,872 | 7/1993 | Mumola | 359/40 |
| 5,240,796 | 8/1993 | Lee et al. . | |
| 5,254,218 | 10/1993 | Roberts et al. . | |
| 5,281,500 | 1/1994 | Cathey et al. | 430/5 |
| 5,288,568 | 2/1994 | Cathey, Jr. | 430/5 |
| 5,288,569 | 2/1994 | Lin | 430/5 |
| 5,372,901 | 12/1994 | Rolfson et al. . | |
| 5,468,578 | 11/1995 | Rolfson | 430/5 |
| 5,487,963 | 1/1996 | Sugawara | 430/5 |

(List continued on next page.)

OTHER PUBLICATIONS

Ahn, C., et al., "Study of optical proximity effects using off–axis illumination with attenuated phase shift mask", *Proceedings of SPIE*, vol. 2440, Society of Photo–Optical Instrumentation Engineers, Bellingham, WA, 222–39, (1995).

Barouch, E., et al., "Vector aerial image with off–axis illumination", *Proceedings of SPIE*, vol. 1927, Pt. 2, Optical/Laser Microlithography Conference, San Jose, CA, 686–708, (1993).

Bor, Z., et al., "New phase–shifting technique for deep UV excimer laser–based lithography", *Proceedings of SPIE*, vol. 2380, Society of Photo–Optical Instrumentation Engineers, Bellingham, WA, 195–202, (1995).

Brunner, T.A., "Rim phase shift mask combined with off–axis illumination: a path to 0.5 lambda/numerical aperture geometries", *Optical Engineering*, vol. 32, No. 10, 2337–43, (Oct. 1993).

Erdelyi, M., et al., "Enhanced microlithography using combined phase shifting and off–axis illumination", *Japanese Journal of Applied Physics*, Part 2: vol. 34, No. 12A, L1629–L1631, (Dec . 1, 1995).

Erdelyi, M., et al., "New interferometric phase–shifting technique for sub–half–micron laser microlithography", *Proceedings of SPIE*, vol. 2440, Society of Photo–Optical Instrumentation Engineers, Bellingham, WA, 827–37, (1995).

(List continued on next page.)

*Primary Examiner*—S. Rosasco
*Attorney, Agent, or Firm*—Schwegman, Lundberg, Woessner & Kluth P.A.

[57] ABSTRACT

A subresolution grating composed of approximately circular contacts is fabricated around the border of the primary pattern of a photomask. As a result, resolution at the edges of the photomask pattern is improved when the pattern is printed on a wafer surface. In addition, the reduced leakage enables a more efficient use of the glass plate on which the photomask is fabricated as well as a more efficient use of the wafer surface as a result of being able to place patterns closer together.

9 Claims, 3 Drawing Sheets

U.S. PATENT DOCUMENTS

| | | |
|---|---|---|
| 5,495,959 | 3/1996 | Rolfson . |
| 5,503,951 | 4/1996 | Flanders et al. .............................. 430/5 |
| 5,527,645 | 6/1996 | Pati et al. ..................................... 430/5 |
| 5,536,606 | 7/1996 | Doan ............................................ 430/5 |
| 5,546,225 | 8/1996 | Shiraishi .................................. 359/559 |
| 5,565,286 | 10/1996 | Lin ............................................... 430/5 |
| 5,567,573 | 10/1996 | Morton ..................................... 430/320 |
| 5,576,126 | 11/1996 | Rolfson . |
| 5,582,939 | 12/1996 | Pierrat ......................................... 430/5 |
| 5,667,918 | 9/1997 | Brainerd et al. . |
| 5,672,450 | 9/1997 | Rolfson . |
| 5,686,208 | 11/1997 | Le et al. ...................................... 430/5 |
| 5,691,541 | 11/1997 | Ceglio et al. ............................. 250/492 |
| 5,695,896 | 12/1997 | Pierrat . |
| 5,718,829 | 2/1998 | Pierrat ......................................... 430/5 |
| 5,759,724 | 6/1998 | Rolfson . |
| 5,766,829 | 6/1998 | Cathey et al. . |
| 5,786,116 | 7/1998 | Rolfson . |
| 5,827,625 | 10/1998 | Lucas et al. ................................. 430/5 |

OTHER PUBLICATIONS

Ham, Y., et al., "Fundamental anlysis on fabrication of 256 MB DRAM using the phase shift technology", *Proceedings of SPIE*, vol. 2197, Optical/Laser Microlithography VII Conference, San Jose, CA, 243–52, (1994).

Kim, K., et al., "Implementation of i–line lithography to 0.30 um design rules", *Proceedings of SPIE*, vol. 2440, Society of Photo–Opitcal Instrumentation Engineers, Bellingham, WA, 76–87, (1995).

Levenson, M.D., "Extending optical lithography to the gigabit era", *Microlithography World*, vol. 3, No. 4, (Autumn 1994).

Lin, B.J., "The Attenuated Phase–Shifting Mask", *Solid State Technology*, 35, 43–47, (Jan. 1992).

Loong, W., et al., "Simulation study of a new phase–shifting mask: halftone–rim", *Proceedings of SPIE*, vol. 2440, Society of Photo–Optical Instrumentation Engineers, Bellingham, WA 448–57, (1995).

Ogawa, T., et al., "Subquarter micron optical lithography with practical superresolution technique", *Proceeding of SPIE*, vol. 2440, Society of Photo–Opitcal Instrumentation Engineers, Bellingham, WA, 772–83, (1995).

Thakar, G.V., et al., "High performance 0.3 mu m CMOS I–line lithography and BARC", *Digest of Technical Papers*, 1995 IEEE Symposium on VLSI Technology, Piscataway, NJ, 75–76, (1995).

Yan, P., et al., "Sub–micron low–k/ /1 imaging characteristics using a DUV printing tool and binary masks", *Proceedings of SPIE*, vol. 2440, Society of Photo–Optical Instrumentation Engineers, Bellingham, WA, 270–77, (1995).

SUBRESOLUTION GRATING FOR ATTENUATED PHASE SHIFTING MASK FABRICATION

FIELD OF THE INVENTION

The present invention relates in general to methods and apparatus for photolithography, and particularly to fabricating attenuating phase shifting masks.

BACKGROUND OF THE INVENTION

There are three major methods of optically transferring a photomask pattern to a wafer. These are contact printing, proximity printing, and projection printing. In the fabrication of integrated circuits projection printing is used almost exclusively. In most conventional systems, each photomask is fabricated to include the primary pattern (the boundaries of the over-all circuit). Once a mask is complete, it is printed many times on a wafer surface using a step-and-repeat process which is well-known in the art. The result is a pattern of dies covering the wafer surface.

In order to efficiently use the available wafer surface, the ability to accurately and precisely transfer patterns onto the wafer surface is critical. Thus, the equipment used to project patterns onto the wafer surface must provide, among other aspects, good resolution. The term 'resolution' describes the ability of the optical system to distinguish closely-spaced objects. The resolution of the optical lithography printing system is of major importance, since it is the main limitation of minimum device size. In modern projection printers the quality of the optical elements is so high that their imaging characteristics are limited by diffraction effects, and not by lens aberrations (diffraction limited systems).

There are a variety of photomasks used in conventional very large scale integration (VLSI) circuit fabrication processes. One widely used type is the attenuated phase-shifting mask, which has the advantage of being a two layer structure, simplifying the manufacturing process. Attenuated phase-shifting masks, described in Burn J. Lin, "The Attenuated Phase-Shift Mask", 43–47 Solid State Technology (January 1992), use a slightly transmissive absorber with a 180° phase-shift in the place of the opaque material in the mask pattern. Unlike many other phase-shifting masks, attenuated phase-shifting masks can be used for any arbitrary mask pattern. An attenuated phase-shifting mask shifts the phase of dark areas but with an attenuated amplitude to prevent producing too much light in those areas. The negative amplitude provides the desired improvement in image edge contrast, while the attenuation prevents the negative amplitude from becoming a problem by controlling the intensity. Resolution of closely packed features is further improved when using an attenuated phase-shifting mask incorporating a mask bias, because exposure times and diffractive effects can be reduced.

When a primary mask pattern is fabricated using attenuating phase shifting material, the determination of where to locate adjacent dies must provide for at least two considerations. One is that the mask plate cannot extend to the edge of the die because leakage through the attenuated material at the edge of the primary pattern produces a shading effect, reducing the resolution of the pattern edge. The other concern is that, if adjacent dies are located too close together, the leakage at the edge of the mask pattern when printing one die will detrimentally effect the neighboring die(s). In order to make efficient use of the available wafer surface, there is a need to minimize the detrimental optical effects occurring at the edges of the primary mask pattern. This would allow more precise definition of die boundaries and closer placement of adjacent dies.

It is known in the art to employ diffraction gratings to improve mask feature resolution by turning optical effects such as diffraction to an advantage. Conventional diffraction gratings consist of rectangular features arranged at equidistant intervals. It should be noted that, in integrated circuit fabrication, a diffraction grating is not printed per se. Instead, the grating is employed to control optical effects such as diffraction. The pattern of the grating produces destructive interference, thereby providing some amount of control over intensity patterns on the wafer surface.

One example of a use for such patterns, often referred to as "subresolution gratings" or "zero electrical field gratings", is in the manufacture of attenuated phase-shifting masks, where the gratings are employed to reduce the amount of light going through the attenuated material at the edge of the primary pattern. The subresolution gratings used in conventional processing control optical effects by manipulating both the exposure parameters and the size and relative placement of rectangular contacts. FIG. 1 shows an example of a portion of a mask incorporating a conventional subresolution grating. In the example shown, contacts 110 are separated by a space equal to the dimension of the contacts 110.

FIG. 2 is a graphic representation showing subresolution grating leakage versus contact size for the conventional subresolution grating of FIG. 1. As shown in FIG. 2, the efficiency of the conventional grating is somewhat improved when the contact size is reduced for all numerical apertures evaluated. As can be seen from graph 200, however, the conventional subresolution grating pattern experiences a minimum residual intensity of at least 25% for even the smallest contact sizes. As a result, there is a point at which, using conventional methods, pattern resolution cannot be further improved. This creates a barrier to further efficiencies in printing mask patterns on a wafer. What is needed is a method for fabricating a photomask with reduced energy leakage at the edges of the primary pattern.

SUMMARY OF THE INVENTION

The above mentioned problems with photomasks and other limitations are addressed by the present invention which will be understood by reading and studying the following specification. According to one embodiment of the present invention a subresolution grating is incorporated in the border demarcating a primary photomask pattern. In one embodiment the photomask pattern incorporates phase-shifting techniques and is composed of attenuating material. In another embodiment the border is composed of the same material as the photomask. According to a further embodiment the subresolution grating comprises approximately circular contacts. According to one implementation of the present invention the contacts are octagonal.

In another embodiment of the present invention a method for fabricating a photomask with higher resolution is provided. The method comprises the steps of preparing a glass plate, transferring a primary pattern onto the glass plate, and fabricating a plurality of approximately circular contacts around the edge of the primary pattern. According to one embodiment the step of transferring a primary pattern comprises selectively depositing attenuating material such that one or more of the mask features operate as phase shifters. In another embodiment the fabrication step includes fabricating octagonal contacts.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

It is well-known in the art to fabricate a border surrounding the primary pattern of a photomask to aid in isolating individual patterns as they are printed on a wafer surface, and to serve as a buffer to reduce encroachment on previously printed patterns adjacent to location where a pattern being printed. When fabricating an attenuated phase-shifting photomask, the designer has the option of bounding the primary pattern with a deposition of either opaque chrome or attenuating material. The design parameters for either option have to take into account optical effects (such as diffraction) which limit the attainable resolution of the pattern edges and may overwrite portions of adjacent pattern areas when the pattern is printed on a wafer surface. As described above, where the pattern edge consists of attenuating material, incorporating a subresolution pattern reduces the negative optical effects and improves pattern resolution.

Figure 1:
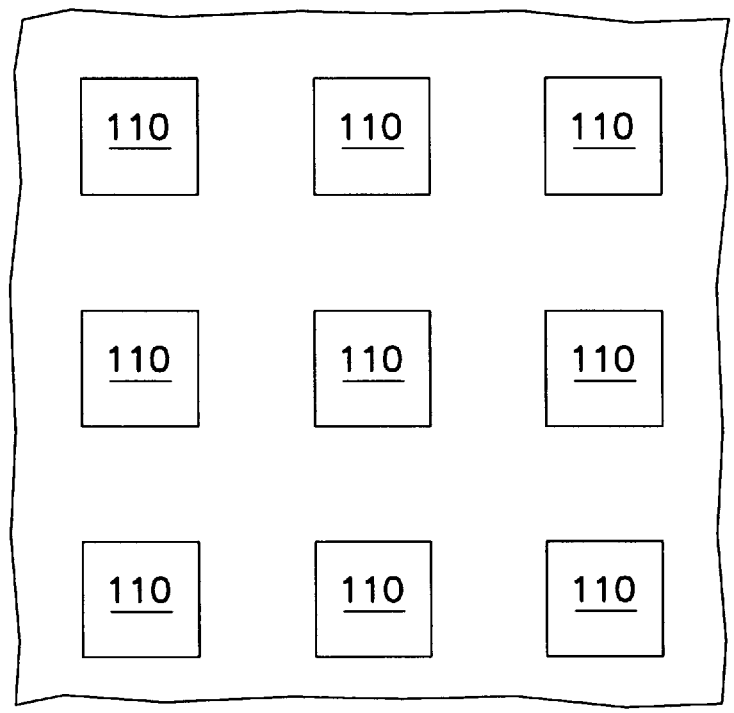
FIG. 1 shows an example of a portion of a conventional mask incorporating a subresolution grating.
Figure 3:
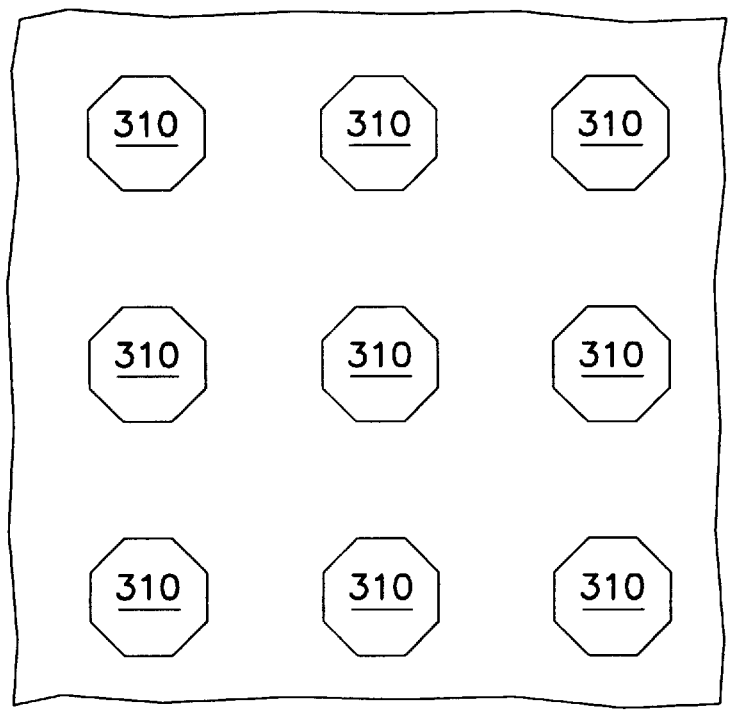
FIG. 3 is a block diagram illustrating a portion of a photomask incorporating a subresolution grating according to one embodiment of the present invention.
Figure 2:
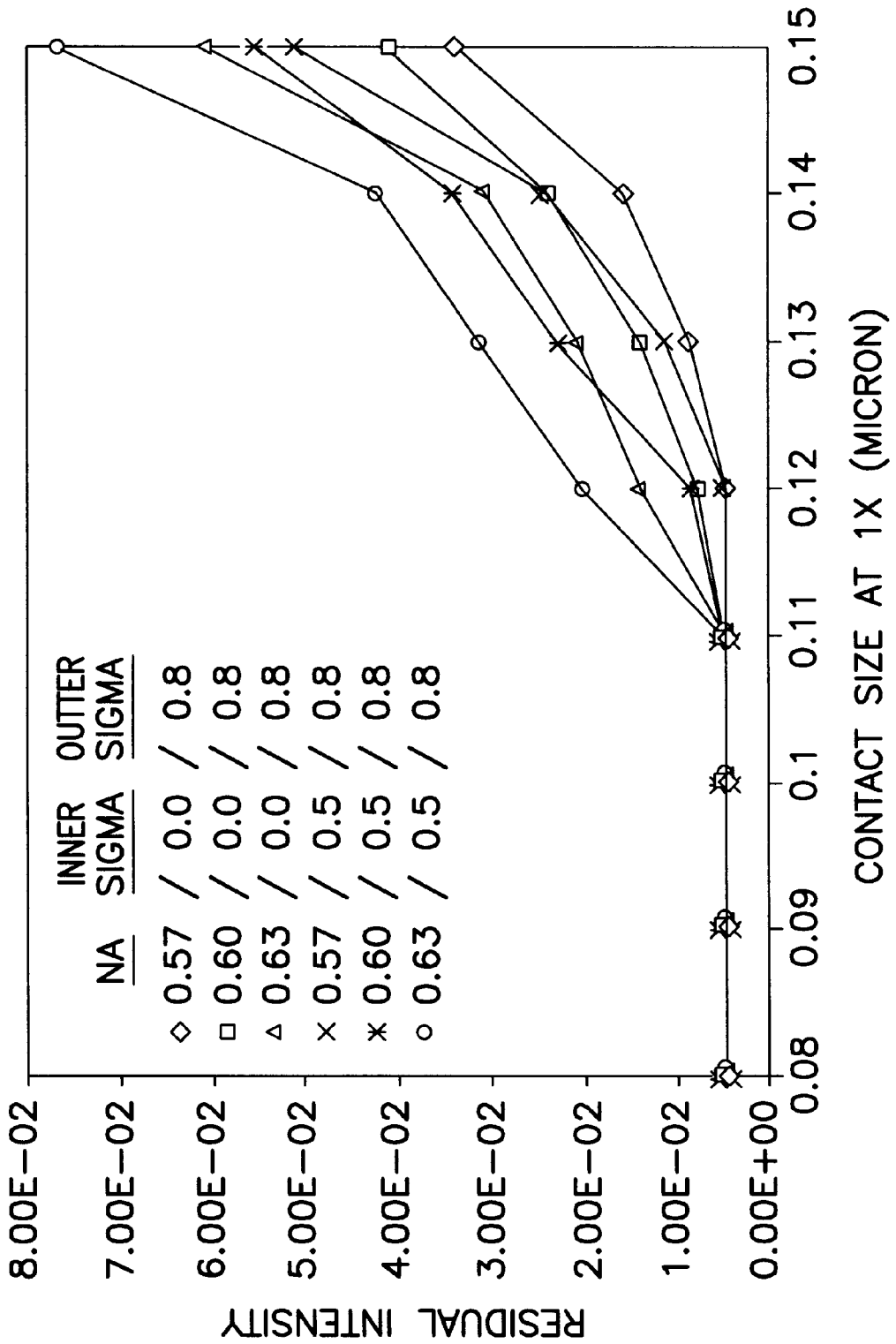
FIG. 2 is a graphic representation showing subresolution grating leakage versus contact size for the conventional subresolution grating shown in FIG. 1.

Conventional subresolution gratings consist of regularly-spaced rectangular contacts. As discussed above, rectangular contacts are limited in the amount of resolution they provide. The system of the invention provides, among other features, a novel solution to that limitation. According to one embodiment of the present invention, the subresolution grating incorporates contacts which are approximately circular. FIG. 3 is a block diagram illustrating a portion of a photomask incorporating a subresolution grating according to one embodiment of the present invention. In the example shown in FIG. 3, contacts 310 are octagonal in shape. Those skilled in the art will recognize that the described embodiments are included for exemplary purposes only and that other contact shapes which approximate a circle may be incorporated in the diffraction grating without exceeding the spirit and scope of the present invention. According to the embodiment shown, the contacts are placed such that they are separated from each other by a distance equal to the diameter of each contact 310. Those skilled in the art will recognize that other distances may be used, dependent upon the desired optical effects, without exceeding the spirit and scope of the present invention.

When the mask pattern is printed on the wafer surface, the diffraction grating around the edge of the pattern creates a diffraction pattern which reduces the zero-node diffraction to 0 and all other diffractions to an angle large enough to miss the wafer surface all together. The net result is improved resolution in the pattern edges, allowing the die pattern to extend closer to the edge of the mask plate and adjacent daises to be located closer together.

Figure 4:
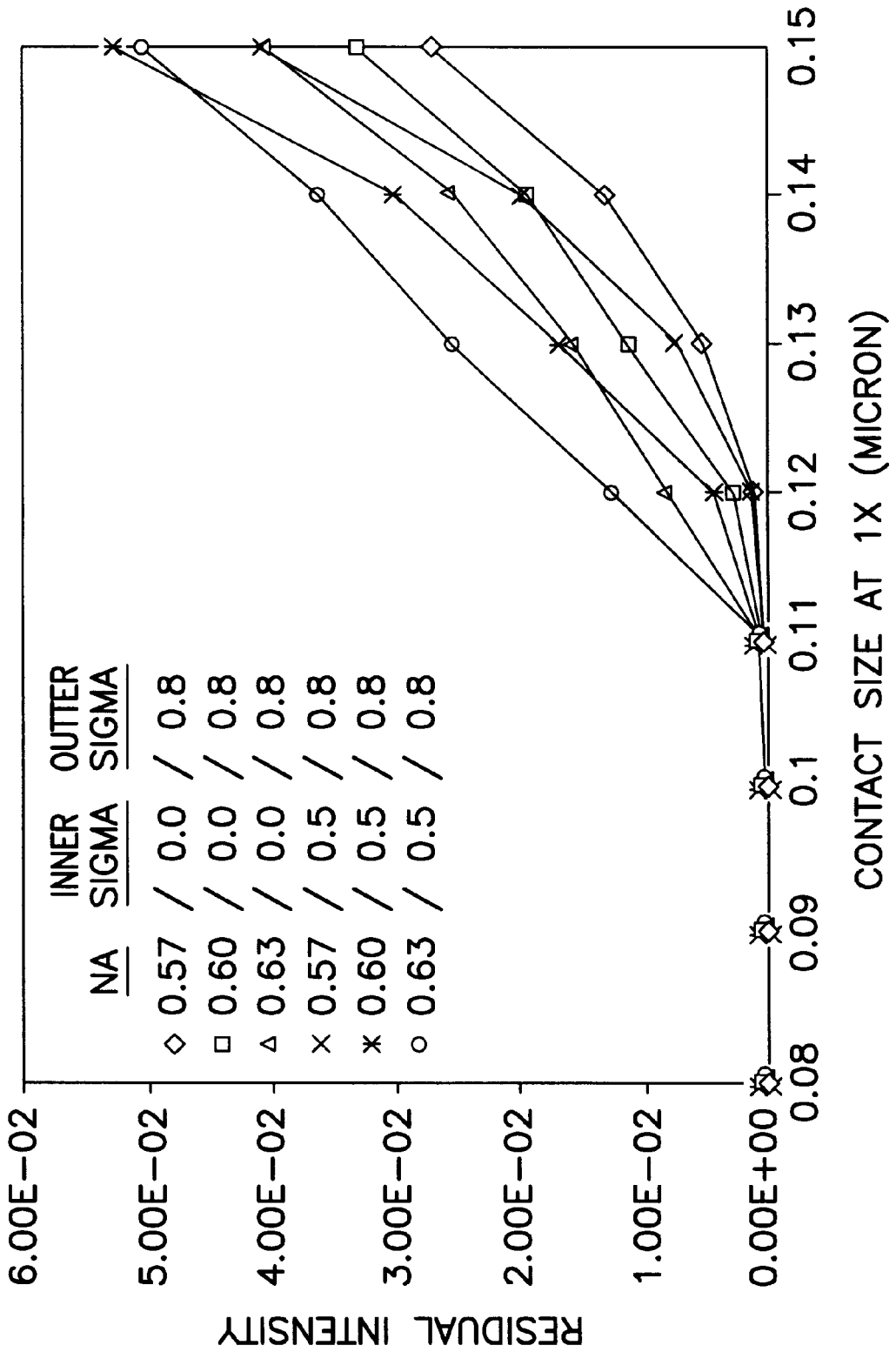
FIG. 4 is a graphic representation correlating subresolution leakage and contact size in an environment incorporating the subresolution grating of FIG. 3.

FIG. 4 is a graphic representation correlating subresolution leakage and contact size in an environment incorporating the embodiment of present invention shown in FIG. 3. As can be seen from the graph of FIG. 4, for contact sizes of 0.11 microns or less there is virtually no residual intensity over a range of numerical apertures. The best performance is using a contact size between 0.9 and 1.0 microns. By effectively reducing the leakage around the primary pattern to zero, the improved subresolution grating of the present invention enables high resolution at the edges of the primary mask pattern. As a result, patterns incorporating the subresolution grating of the present invention may be printed closer together on the wafer surface without impacting the mask quality or clarity.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of fabricating a photomask, comprising the steps of:

preparing a glass plate;

transferring a primary pattern onto the glass plate, the primary pattern including an edge circumscribing the primary pattern; and fabricating a plurality of approximately round contacts in the edge of the primary pattern.

2. The method of claim 1, wherein the step of fabricating a plurality of approximately round contacts comprises forming octagonal contacts.

3. The method of claim 1, wherein the step of transferring the primary pattern comprises selectively depositing attenuating material.

4. A method of fabricating a photomask, comprising the steps of:

preparing a glass plate;

selectively depositing attenuating material on the glass plate to form a primary pattern, the primary pattern including an edge circumscribing the primary pattern; and fabricating a plurality of octagonal contacts in the edge of the primary pattern.

5. A photomask, comprising:

a primary pattern;

a border outlining the primary pattern; and a plurality of approximately circular contacts in the border outlining the primary pattern.

6. The photomask of claim 4, wherein the pattern and the border are composed of attenuating phase-shifting material.

7. The photomask of claim 6, wherein the plurality of approximately circular contacts are octagonal.

8. The photomask of claim 6, wherein the plurality of approximately circular contacts are subresolution in size.

9. A photomask, comprising:

a phase-shifting pattern formed with attenuating material, including a border circumscribing the phase-shifting pattern;

a plurality of octagonal contacts formed in the border.

* * * * *